United States Patent [19]

Neale

[11] 3,816,197

[45] June 11, 1974

[54] FILM DEPOSITED SEMICONDUCTOR DEVICES

[75] Inventor: Ronald G. Neale, Birmingham, Mich.

[73] Assignee: Energy Conversion Devices, Inc., Troy, Mich.

[22] Filed: June 21, 1972

[21] Appl. No.: 264,937

Related U.S. Application Data

[63] Continuation-in-part of Ser. No. 867,341, Oct. 17, 1969, Pat. No. 3,675,090.

[52] U.S. Cl. .......................... 156/8, 156/11, 156/17

[51] Int. Cl. .......................... H01l 7/50

[58] Field of Search ............ 307/88.5; 156/3, 8, 11, 156/17; 317/234, 235; 29/576; 96/36.2

[56] References Cited

UNITED STATES PATENTS 3,326,729 6/1967 Sigher .............................. 156/17 X 3,597,297 8/1971 Scott-Monck et al. ......... 117/212 X

*Primary Examiner*—William A. Powell

*Attorney, Agent, or Firm*—Wallenstein, Spangenberg, Hattis & Strampel

[57] ABSTRACT

A method comprising providing a substrate with an electrode-forming layer on the surface thereof, placing the substrate in a contaminant-free space and while in said space removing the exposed surface portions of said electrode-forming layer and depositing generally over the substrate and said electrode-forming layer an active semiconductor material forming a semiconductor switch device, applying a mask over selected areas of said active semiconductor material to cover only the area thereof to be occupied thereby in a completed device, and selectively removing the active semiconductor layers not covered by said mask.

10 Claims, 4 Drawing Figures

PATENTED JUN 11 1974 3,816,197

FILM DEPOSITED SEMICONDUCTOR DEVICES

Figure 1:
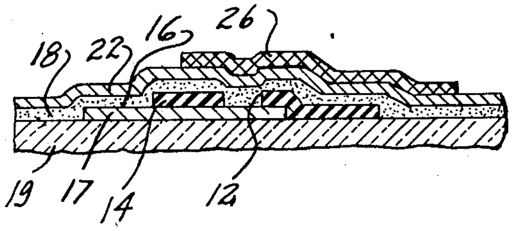

This is a continuation-in-part of my application Ser. No. 867,341 filed Oct. 17, 1969 now U.S. Pat. No. 3,675,090 issued July 4, 1972.

This invention relates generally to film deposited electronic components and has its most important application in film deposited semiconductor switch devices like those disclosed in U.S. Pat. No. 3,271,591 issued Sept. 6, 1966. In the semiconductor threshold and memory switch devices disclosed in said Patent 3,271,591 and referred to therein as "mechanism" and "Hi-Lo" devices, respectively, the active semiconductor materials are substantially disordered and generally amorphous materials which, when a voltage equal to or greater than a threshold voltage value is applied across a pair of electrodes in contact with the active semiconductor material, a filamentous conductive path is formed therein to alter the portion of the material occupied by the path from an initially high resistance current blocking condition to a low resistance current conducting condition. In threshold switch devices the conducting condition of the device involved persists until the current therethrough is reduced below a given holding current value, and in the memory switch device the semiconductor material remains in a low resistance conducting condition even when the current and voltage applied thereto is interrupted. The latter semiconductor material is returned to a non-conductive state by application of a reset current thereto. An increase in voltage applied to a threshold or memory switch device increases the current therethrough and the low resistance of the device decreases to maintain a fairly constant voltage drop across the semiconductor material by the enlargement of the diameter of the filamentous path through which current flows in the material.

The semiconductor material is generally supplied with electrodes on opposite sides or surfaces thereof. The electrode materials used for the threshold and memory switch devices described must be carefully selected to avoid contamination of the semiconductor materials referred to. Although aluminum is a highly effective current conductor for printed circuitry leading to these devices, it has been found to be a very unsatisfactory electrode-forming material therefor because aluminum migrates into the semiconductor materials when current flow is from an aluminum electrode into the active semiconductor material. Current flow in the opposite direction, i.e., from the semiconductor materials into the aluminum, does not cause such a migration of aluminum. This problem of aluminum migration is overcome by using refractory materials like molybdenum as the electrode-forming material of the switch devices, since molybdenum isolates the aluminum from the semiconductor material. The aforesaid threshold and memory semiconductor devices of U.S. Pat. No. 3,271,591 are inherently bi-directional devices, and when used as such, both electrodes thereof should be made of substantially amorphous refractory materials. Where the semiconductor materials are, as these materials, substantially disordered and generally amorphous semiconductor materials, the refractory electrode-forming material should be deposited in a substantially amorphous state so it does not adversely affect the substantially disordered and generally amorphous condition of the semiconductor material. Substantially crystalline electrode-forming materials would tend to crystallize the desirably generally amorphous semiconductor materials when in direct contact therewith. (The expression "substantially amorphous" includes micro-crystalline materials which, using conventional spectographic equipment, do not indicate any crystalline structure.) Other refractory conductive materials such as substantially amorphous tantalum, niobium, tungsten, and refractory metal oxides, carbides and sulphides, may be substituted for the substantially amorphous molybdenum.

It has also been discovered that various particle or gaseous contaminants from the atmosphere can become embedded or attached chemically or otherwise to the electrode-forming and/or the semiconductor layers of the devices during the deposition and processing thereof which adversely affect the operation thereof. Great care must thus be taken to prevent contaminants from reaching the critical interfaces between the electrodes of the switch devices and the active semiconductor material. In accordance with the invention, to overcome this problem, a bottom electrode, preferably of amorphous molybdenum or the like, and where a pore structure device is preferred, an insulating island with a pore are first formed on a substrate in any suitable manner. (If the substrate is to include a number of deposited switch devices, then the desired pattern of electrodes and insulating islands of the switch devices are formed on the substrate.) The resulting substrate is then placed in a vacuum system, preferably in a sputtering chamber where it becomes the cathode in an RF sputtering process where the exposed surfaces of the substrate are subject to ion bombardment to remove any contaminated surfaces of the substrate, each bottom electrode and each insulating island. (Less desirably, the exposed surfaces of the substrate can be surface cleaned, as by applying the surface thereof to an etching solution and the substrate then immediately placed in the sputtering chamber.) Then, without breaking the vacuum seal, a layer of active semiconductor material is evaporated or sputtered over the entire substrate surface to fill or partially fill the pores of all the switch devices involved with active semiconductor material. The critical bottom interface between the semiconductor and lower electrode-forming layer are now isolated. If it is desired to produce an active semiconductor configuration different from that of the upper electrode to be applied thereto, the application of the upper electrode layer or layers is postponed to a later portion of the process being described. Otherwise, the upper electrode layer or layers are next applied (which is the most efficient and preferred form of the invention) so that the interface between the semiconductor and immediate upper electrode-forming layers are also then immediately completely isolated from the surrounding environment. The treated substrate can, if desired, then be removed from the sputtering chamber where the next process step can be most conveniently performed under normal or less stringent conditions. In either case, a photo-resist material is then deposited over the entire surface of the active semiconductor layer in the former example, and over the entire upper electrode-forming layer in the latter example, and by suitable photographic techniques precise selected areas are exposed to fix the photo-resist material and it is those areas of the photo-resist material overlying the portions of the semiconductor and electrode-forming layer or layers which are to form the switch device involved. The unexposed areas of the photo-resist are then removed. A suitable etching or removal process then follows which by ion bombardment, or by using suitable chemicals or the like, the active semiconductor material and outer electrode-forming layer or layers, if present, where those portions thereof not covered by the resist material, are removed. The resist material is then removed.

When only the active semiconductor material was deposited over the just described treated substrate, the treated substrate may first be quickly surface cleaned, as by applying the surface thereof to the etching solution previously used, and then immediately placed again in the contaminant free space, like the vacuum sputtering chamber referred to, before any appreciable contamination thereof can occur. Alternatively, when the treated substrate has not been surface cleaned before being placed in the contaminant free space like the vacuum sputtering chamber, the exposed active semiconductor material surface of the treated substrate can be cleaned by ion bombardment. In either case, one or more outer layers of electrode-forming material are next applied over the treated substrate in the contaminant free space to cover the active semiconductor material. The undesired portions of the one or more electrode-forming layers are then removed by a selective removal process as above described, which is most conveniently carried out out of the contaminant free space referred to.

Figure 2:
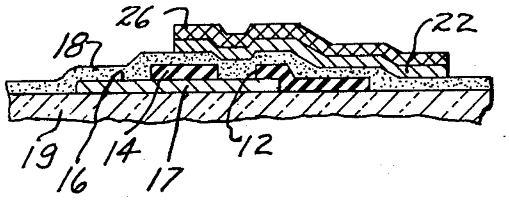
Figure 3:
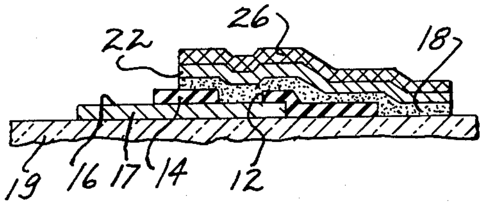
Figure 4:
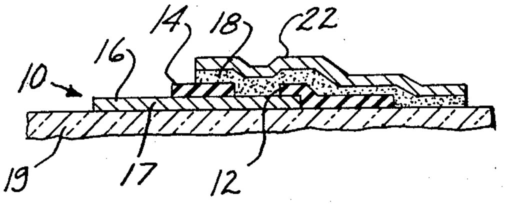

The above and other features and advantages of this invention will be more fully realized and understood from the following details when taken with the accompanying drawings wherein like reference numerals throughout the various views of the drawings are intended to designate similar elements or components. In the drawings:

FIGS. 1–4 illustrate four successive steps in an exemplary process of making a switch device in accordance with the invention, with FIG. 4 constituting the completed device.

Referring now to FIG. 4, there is seen a semiconductor switch device 10 including a pore 12 formed in a layer 14 of insulating material which is preferably a deposit of insulating material formed on an electrode-forming surface 16 of a lower layer 17 of electrode-forming material on a surface of a substrate 19. A layer 18 of active semiconductor material extends into the pore 12 and fills at least the bottom portion thereof and makes electrical contact with the electrode-forming surface 16 over an area limited by the area of the pore 12. The lower electrode-forming layer is most advantageously made of refractory conductive material like amorphous molybdenum, tantalum, niobium tungsten, molybdinum carbide, vanadium sulphide, or other similar refractory metals or carbides, sulphides or oxides thereof, and the substrate 19 may be an insulating body like glass or an insulating film-coated body of semiconductor material and in other cases at least the part thereof overlaid by the electrode-forming layer 17 may be the electrode of an integrated circuit forming a diode or transistor in a silicon chip or the like forming the substrate body. The semiconductor device 10 also has one or more upper electrode-forming layers 22, the layer nearest the semiconductor layer 18 most advantageously being a refractory conductive material like molybdenum deposited over the semiconductor layer 18. An outer layer of a highly conductive material like aluminum or the like (not shown) could overlie the molybdenum layer. Although the electrode-forming layer 22 overlaps the deposit 18 of semiconductor material, the useful or active portion of the semiconductor material is that portion within the pore 12. Although the thickness of the deposit of semiconductor material may vary widely for threshold or memory switch devices like that described in said U.S. Pat. No. 3,271,591, it would generally, as used in this invention, be from about 1 to 15 microns depending on the desired threshold voltage value. In any case, the current conducting path through the active semiconductor material is confined to a limited area defined by the pore 12, thus providing a more uniform current-voltage characteristic for each successive operation of the semiconductor device formed thereby. This limited area also provides a small leakage current path when the semiconductor switch device involved is in its high resistance condition. In most cases, the active semiconductor material will be a substantially disordered and generally amorphous material like that disclosed in said U.S. Pat. No. 3,271,591.

The method of fabricating the semiconductor switch devices 10 previously briefly described is illustrated by the successive FIGS. 1–4. As previously indicated, great care must be taken to prevent contaminants from reaching the critical interfaces between the electrode layers 17 and 22 and the active semiconductor layer 18. The bottom electrode layer 17 of amorphous molybdenum or the like, and the insulating layer 14 with the pore 12 therein, are first deposited on a selected area of the substrate 19 in any suitable manner. (If the substrate is to include a number of deposited switch devices, then the desired pattern of electrode-forming layer 17 and insulating layers 14 of the switch devices are formed on the substrate.)

The resulting substrate is then placed in a vacuum system, preferably in a sputtering chamber, where it becomes the cathode in an RF sputtering process where the exposed surfaces of the substrate are subject to ion bombardment to remove any contaminated surfaces of the substrate 19, bottom electrode-forming layers 16 and insulating layers 14. Then, without breaking the vacuum seal, the active semiconductor material and also preferably the upper electrode-forming materials are then evaporated or sputtered over the entire substrate surface to fill or partially fill the pores 12 of all the switch devices involved with active semiconductor material and to cover the active semiconductor material with electrode-forming material. The critical interfaces between the semiconductor and electrode-forming materials are thus completely isolated from the surrounding environment and so the substrate can then be removed from the sputtering chamber. Next, a soluble photo-resist material 26 may be deposited over the entire surface of the electrode-forming layer and by suitable photographic techniques precise selected areas are exposed to fix the exposed portions of the photo-resist material against removal by a given solvent and it is those portions of the semiconductor and electrode-forming layers underlying the exposed portions of the photo-resist material which are to form the switch device involved. The unexposed areas of the photo-resist are then removed by the solvent, leaving the substrate as shown in FIG. 1.

A selective etching process then follows using suitable chemicals or the like which act preferably first only on the electrode-forming materials and then on the semiconductor material, as illustrated in FIGS. 2 and 3 where those portions thereof not covered by the resist material are removed. FIG. 4 shows the exposed photo-resist layer 26 removed in any suitable way.

It should be understood that numerous modifications may be made in the most preferred form of the invention described above without deviating from the broader aspects thereof.

I claim:

1. A method of forming a semiconductor device on a substrate including a layer of insulating material having a pore in which a first conductive electrode-forming layer is exposed, the method comprising removing surface portions of said first conductive layer exposed by said pore to remove contaminants therefrom, and in a contaminant free space then depositing generally over said pore-containing portion of said insulating layer and the exposed contaminant free surface of said conductive electrode-forming layer a first layer of an active semiconductor material and an overlying layer of a conductive electrode-forming material, applying a mask over selected areas of said overlying electrode-forming and active semiconductor layers overlying the pore containing portion of said insulating layer to cover only the area thereof to be occupied by said overlying conductive electrode-forming and active semiconductor layers in the completed device, and selectively removing the portions of said overlying conductive electrode-forming and active semiconductor layers not covered by said mask.

2. The method of claim 1 wherein said first conductive electrode-forming layer and said overlying conductive electrode-forming layer are of the same material, said removal of said unmasked portions of said layers of active semiconductor material and overlying conductive electrode-forming layers being a two step etching operation where the first etching step affects only said overlying conductive electrode-forming layer and the subsequent etching step affects only said active semiconductor material.

3. A method of forming a semiconductor device including an active semiconductor material deposited over at least one lower electrode-forming layer on the surface of a substrate, the method comprising: removing contaminants from the exposed surface portions of said electrode-forming layer, and in a contaminant free space depositing generally over the substrate including the contaminant free surface of said electrode-forming layer said active semiconductor material, applying a mask over selected areas of said active semiconductor material to cover only the area thereof to be occupied thereby in the completed device, and selectively removing the active semiconductor layers not covered by said mask.

4. The method of claim 3 wherein said contaminants are removed from said exposed surface while in said contaminant free space.

5. The method of claim 3 wherein said contaminants are removed from said exposed surface by physically removing a portion of said exposed surface.

6. A method of forming a semiconductor device including an active semiconductor material deposited over at least one lower electrode-forming layer on the surface of a substrate, the method comprising: removing contaminants from the exposed surface portions of said electrode-forming layer, and in a contaminant free space depositing generally over the substrate including the contaminant free surface of said electrode-forming layer said active semiconductor material, removing the treated substrate from said contaminant free space, applying a mask over selected areas of said active semiconductor material to cover only the area thereof to be occupied thereby in the completed device, and selectively removing the active semiconductor layers not covered by said mask, removing contaminants from the exposed surface portions of said active semiconductor material, and in a contaminant free space depositing generally over the substrate including the contaminant free surface of said active semiconductor material at least one upper electrode-forming layer, applying a mask over selected areas of said upper electrode-forming layer to cover only the area thereof to be occupied thereby in the completed device, and selectively removing the upper electrode-forming layer not covered by said mask.

7. A method of forming a semiconductor device on a substrate including a layer of insulating material with a pore in which a first conductive electrode-forming layer is exposed, the method comprising: placing the substrate in a contaminant free space, and then first removing the exposed surface portions of said first conductive layer to remove any contaminants therefrom, then depositing generally over said pore containing portion of said substrate including the exposed contaminant free surface of said conductive electrode-forming layer a first layer of an active semiconductor material and an overlying layer of a conductive electrode-forming material, removing the treated substrate from said contaminant free space, applying a mask over selected areas of said overlying electrode-forming and active semiconductor layers which mask covers only the area thereof to be occupied by said overlying conductive electrode-forming and active semiconductor layers in the completed device, and selectively removing the portions of said overlying conductive electrode-forming and active semiconductor layers not covered by said mask.

8. A method of forming a semiconductor device on a substrate comprising the steps of: forming a first conductive electrode-forming layer covering only part of a surface of said substrate; removing contaminants from the exposed surface portions of said first conductive electrode-forming layer; and in a contaminant free space then depositing generally over said partially covered surface of said substrate, including the contaminant free surface of said first layer, an active semiconductor material and an overlying layer of a conductive electrode-forming material; applying a mask over selected areas of said overlying electrode-forming and active semiconductor layers to cover only the area thereof to be occupied by said overlying conductive electrode-forming and active semiconductor layers in the completed device, and selectively removing the portions of said overlying conductive electrode-forming and active semiconductor layers not covered by said mask.

9. The method of claim 8 wherein said first conductive electrode-forming layer on said substrate and said overlying conductive electrode-forming layer are of the same material, said removal of said unmasked portions of said layers of active semiconductor material and overlying conductive electrode-forming layers being a two step etching operation where the first etching step affects only said overlying conductive electrode-forming layer and the subsequent etching step affects only said active semiconductor material.

10. A method of forming a semiconductor device on a substrate including a layer of insulating material having a pore in which a first conductive electrode-forming layer is exposed, the method comprising: removing contaminants from the exposed surface portions of said first electrode-forming conductive layer, and in a contaminant free space then depositing generally over said pore-containing portion of said insulating layer and the exposed contaminant free surface of said electrode-forming layer a first layer of an active semiconductor material, removing the treated substrate from said space, applying a mask over selected areas of said active semiconductor layer overlying the pore containing portion of said insulating layer to cover only the area thereof to be occupied by said overlying active semiconductor layers in the completed device, and selectively removing the portions of said active semiconductor layer not covered by said mask.

* * * * *